(12) United States Patent
Li et al.

(10) Patent No.: US 12,032,191 B2
(45) Date of Patent: Jul. 9, 2024

(54) DISPLAY SCREEN COVER AND DISPLAY SCREEN

(71) Applicants: NANJING LOPU CO., LTD., Nanjing (CN); NANJING LOPU TECHNOLOGY CO., LTD., Nanjing (CN)

(72) Inventors: Sheng Li, Nanjing (CN); Bin Zhu, Nanjing (CN); Lili Ji, Nanjing (CN); Chengbing Guo, Nanjing (CN); Lingling Jiang, Nanjing (CN); Yicheng Li, Nanjing (CN)

(73) Assignees: NANJING LOPU CO., LTD., Nanjing (CN); NANJING LOPU TECHNOLOGY CO., LTD., Nanjing (CN)

(*) Notice: Subject to any disclaimer, the term of this patent is extended or adjusted under 35 U.S.C. 154(b) by 177 days.

(21) Appl. No.: 17/948,263

(22) Filed: Sep. 20, 2022

(65) Prior Publication Data
US 2023/0408744 A1 Dec. 21, 2023

Related U.S. Application Data

(63) Continuation of application No. PCT/CN2022/100346, filed on Jun. 22, 2022.

(30) Foreign Application Priority Data

May 25, 2022 (CN) .......................... 202221259527.2

(51) Int. Cl.
*G02B 5/30* (2006.01)
*H04R 1/02* (2006.01)

(52) U.S. Cl.
CPC ........... *G02B 5/3025* (2013.01); *H04R 1/028* (2013.01); *H04R 2499/15* (2013.01)

(58) Field of Classification Search
CPC .. G02B 5/3025; H04R 1/028; H04R 2499/15; H04R 1/023; H04R 1/345; G09F 9/33; G09G 3/32; H05K 5/02
See application file for complete search history.

(56) References Cited

U.S. PATENT DOCUMENTS

| | | | |
|---|---|---|---|
| 9,099,409 B2 * | 8/2015 | Fujita | H10K 59/35 |
| 2009/0121119 A1 * | 5/2009 | Nishi | H04N 23/71 |
| | | | 250/214 LS |

(Continued)

FOREIGN PATENT DOCUMENTS

| | | | | |
|---|---|---|---|---|
| CN | 206210298 U | * | 5/2017 | ............... G09F 9/33 |
| CN | 107075161 A | | 8/2017 | |

(Continued)

*Primary Examiner* — Oyesola C Ojo
(74) *Attorney, Agent, or Firm* — Bayramoglu Law Offices LLC

(57) ABSTRACT

A display screen cover is arranged to correspond to an area array driving plate of a display screen, and the display screen cover includes a cover body and a polarization film assembly. The polarization film assembly is arranged on the back of the cover body, and the polarization film assembly is provided with polarization film through holes and polarization film sound transmission spaces. The polarization film through holes are arranged to correspond to light-emitting tubes of the area array driving plate, and the polarization film sound transmission spaces are arranged to correspond to sound transmission spaces of the area array driving plate. The cover body is provided with cover through holes and cover sound transmission spaces. The cover through holes are arranged to correspond to the polarization film through holes, and the cover sound transmission spaces are arranged to correspond to the polarization film sound transmission spaces.

20 Claims, 6 Drawing Sheets

(56) References Cited

U.S. PATENT DOCUMENTS

2017/0292000 A1* 10/2017 Furuyama ................ H05K 5/06
2020/0294457 A1*  9/2020 Lim ..................... G09G 3/3614
2021/0377670 A1* 12/2021 Strohmann ........... G06F 1/1626

FOREIGN PATENT DOCUMENTS

| CN | 109389912 A |   | 2/2019 |
|----|-------------|---|--------|
| CN | 209328429 U |   | 8/2019 |
| CN | 211348878 U | * | 8/2020 |
| CN | 211348878 U |   | 8/2020 |
| CN | 215341800 U |   | 12/2021 |
| KR | 20120055179 A |  | 5/2012 |

* cited by examiner

DISPLAY SCREEN COVER AND DISPLAY SCREEN

CROSS REFERENCE TO THE RELATED APPLICATIONS

This application is the continuation application of International Application No. PCT/CN2022/100346, filed on Jun. 22, 2022, which is based upon and claims priority to Chinese Patent Application No. 202221259527.2, filed on May 25, 2022, the entire contents of which are incorporated herein by reference.

TECHNICAL FIELD

The present disclosure relates to the technical field of the display screen, in particular to a display screen cover and a display screen.

BACKGROUND

With the development of LED movie screen technology, small-pitch LED movie screen has already entered the cinema market. However, the cinema play system not only requires high-definition and realistic pictures but also attaches equal importance to sound effects. The best audio-visual effect can be achieved perfectly only by combining sound positioning and picture. To achieve the best audio-visual effect, traditional cinemas use a sound transmission screen, and the sound of the loudspeakers can be transmitted through the screen.

However, the small-pitch LED movie screen currently used does not have a sound transmission function. It is difficult to achieve the best audio-visual effect by placing loudspeaker devices around the small-pitch LED movie screen. When the small-pitch LED movie screen is used in the IMAX theater, it is difficult to ensure the perfect fusion of picture and sound by the screen, which cannot transmit sound, resulting in a poor audio-visual effect.

SUMMARY

To solve the above technical problems, the present disclosure provides a display screen cover and a display screen, which can realize the accurate positioning of sound synchronized with the picture to improve the audio-visual effect.

The technical solution of the present disclosure is as follows.

A display screen cover is provided. The display screen cover is arranged to correspond to an area array driving plate of a display screen, and the display screen cover includes a cover body and a polarization film assembly. The polarization film assembly is arranged on the back of the cover body, and the polarization film assembly is provided with polarization film through holes and polarization film sound transmission spaces. The polarization film through holes are arranged to correspond to light-emitting tubes of the area array driving plate, and the polarization film sound transmission spaces are arranged to correspond to sound transmission spaces of the area array driving plate. The cover body is provided with cover through holes and cover sound transmission spaces. The cover through holes are arranged to correspond to the polarization film through holes, and the cover sound transmission spaces are arranged to correspond to the polarization film sound transmission spaces.

According to an embodiment of the present disclosure, the light-emitting tubes are arranged in an array on the area array driving plate, and the polarization film through holes of the polarization film assembly are arranged in an array to correspond to the light-emitting tubes of the area array driving plate.

According to an embodiment of the present disclosure, the sound transmission spaces are arranged in an array on the area array driving plate, and the polarization film sound transmission spaces of the polarization film assembly are arranged in an array to correspond to the sound transmission spaces of the area array driving plate.

According to an embodiment of the present disclosure, the polarization film assembly is a circular polarization film assembly.

According to an embodiment of the present disclosure, the polarization film assembly is a linear polarization film assembly.

According to an embodiment of the present disclosure, the cover through holes of the cover body are arranged in an array to correspond to the polarization film through holes of the polarization film assembly.

According to an embodiment of the present disclosure, the cover sound transmission spaces of the cover body are arranged in an array to correspond to the polarization film sound transmission spaces of the polarization film assembly.

According to an embodiment of the present disclosure, each of the cover through holes is an arbitrary-shaped through hole.

According to an embodiment of the present disclosure, each of the cover sound transmission spaces is an arbitrary-shaped sound transmission space.

A display screen includes the display screen cover provided by the above embodiment, and a ratio of the sound transmission spaces to the display screen ranges from 0 to 40%.

The present disclosure has the following advantages.

The display screen cover of the present disclosure is arranged to correspond to the area array driving plate of the display screen, and the polarization film through holes and the polarization film sound transmission spaces are arranged to correspond to the area array driving plate. In addition, the cover through holes and the cover sound transmission spaces are arranged to respectively correspond to the polarization film through holes and the polarization film sound transmission spaces. Therefore, the accurate positioning of sound synchronized with the picture can be realized to improve the audio-visual effect.

DETAILED DESCRIPTION OF THE EMBODIMENTS

The technical solutions of the embodiments of the present disclosure are clearly and completely described below in conjunction with the drawings in the embodiments of the present disclosure. The embodiments described are only part of the embodiments of the present disclosure, not all embodiments. Based on the embodiments of the present disclosure, all other embodiments obtained by those having ordinary skill in the art without creative work shall fall within the scope of protection of the present disclosure.

Figure 1:
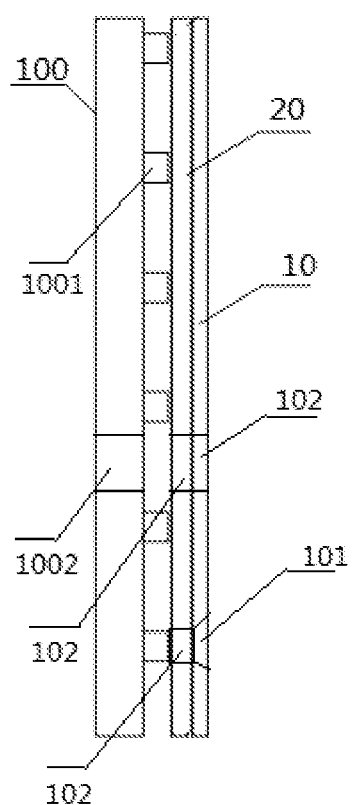
FIG. 1 shows a structural diagram of a display screen cover according to an embodiment of the present disclosure.

FIG. 1 shows a schematic diagram of the structure of a display screen cover according to an embodiment of the present disclosure.

As shown in FIG. 1, the display screen cover of an embodiment of the present disclosure is arranged to correspond to an area array driving plate 100 of a display screen. The display screen cover includes a cover body 10 and a polarization film assembly 20. The polarization film assembly 20 is arranged on the back of the cover body 10, and the polarization film assembly 20 is provided with polarization film through holes 201 and polarization film sound transmission spaces 202. The polarization film through holes 201 are arranged to correspond to light-emitting tubes 1001 of the area array driving plate, and the polarization film sound transmission spaces 202 are arranged to correspond to the sound transmission spaces 1002 of the area array driving plate. The cover body 10 is provided with cover through holes 101 and cover sound transmission spaces 102. The cover through holes 101 are arranged to correspond to the polarization film through holes 201, and the cover sound transmission spaces 102 are arranged to correspond to the polarization film sound transmission spaces 202.

Figure 2:
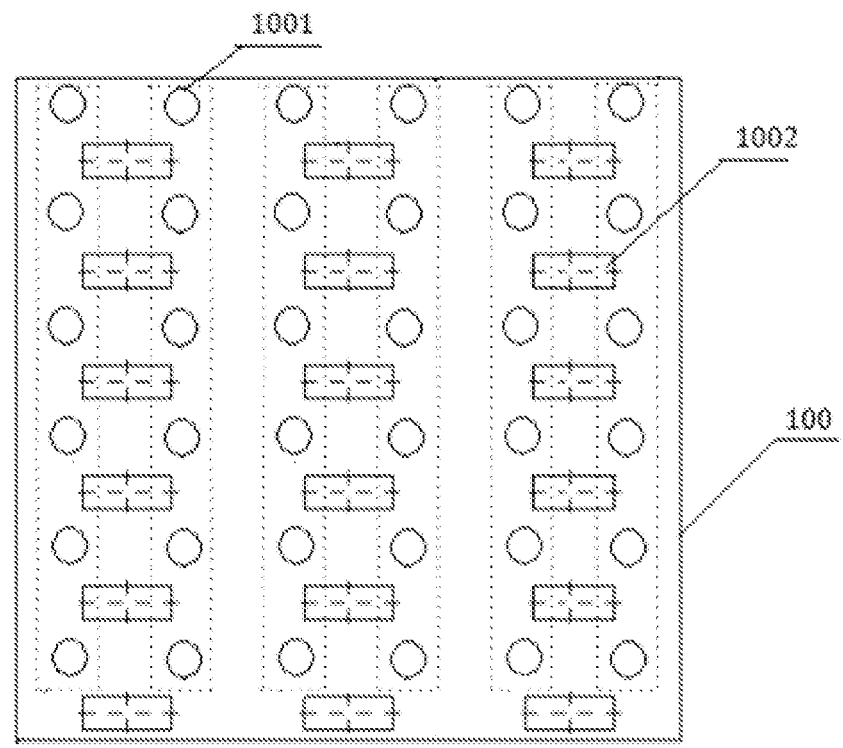
FIG. 2 shows a top view of an area array driving plate according to an embodiment of the present disclosure.

In an embodiment of the present disclosure, as shown in FIG. 2, light-emitting tubes 1001 and sound transmission spaces 1002 are respectively arranged in an array on the area array driving plate 100, such as 36 light-emitting tubes 1001 arranged in 6 rows*6 columns in a rectangular array, and 18 sound transmission spaces 1002 arranged in 6 rows*3 columns in the rectangular array. It should be noted that in practice, the light-emitting tubes arranged in an array on the area array driving plate generally employ the array arrangement mode of 8N rows*8M columns (N and M are both positive integers). The rectangular array arrangement of 6 rows*6 columns in this embodiment is only for convenient illustration.

Corresponding to the area array driving plate shown in FIG. 2, the polarization film assembly 20 in the display screen cover of the present disclosure is provided with polarization film through holes 201 arranged in an array and polarization film sound transmission spaces 202 in an array. For example, 36 polarization film through holes 201 are arranged in 6 rows*6 columns in the rectangular array and 18 polarization film sound transmission spaces are arranged in 6 rows*3 columns in the rectangular array. Specifically, the polarization film assembly 20 may be a circular polarization film assembly and a linear polarization film assembly. Taking the circular polarization film assembly as an example, the structural features of the display screen cover of the present disclosure are described below in detail.

Figure 3:
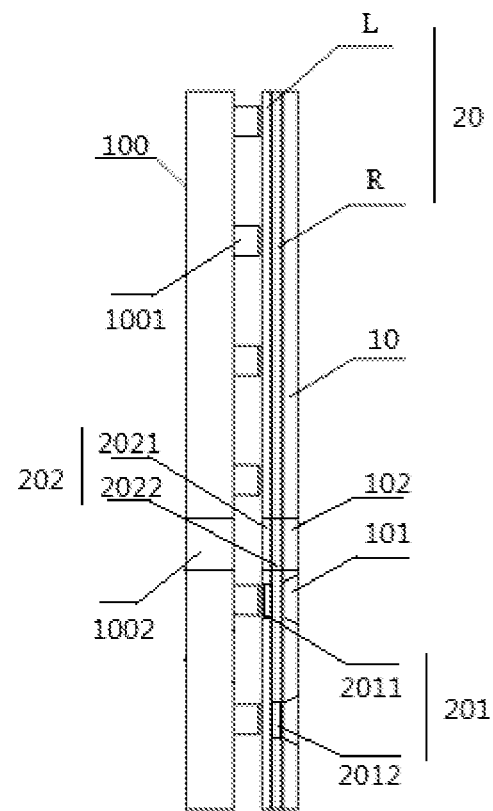
FIG. 3 shows a structural diagram of a display screen cover according to an embodiment of the present disclosure.

In an embodiment of the present disclosure, as shown in FIG. 3, the polarization film assembly 20, which is the circular polarization film assembly, may include a left-handed polarization film L and a right-handed polarization film R. The right-handed polarization film R is arranged on the back of the cover body 10, and the left-handed polarization film L is arranged on the back of the right-handed polarization film R. In addition, the shape and size of each of the left-handed polarization film L and the right-handed polarization film R are the same as that of the cover body 10. Moreover, the right-handed polarization film R and the left-handed polarization film L are successively laminated on the back of the cover body 10 through adhering. Obviously, the way in which the right-handed polarization film R and the left-handed polarization film L are arranged on the back of the cover body 10 is not the only way. In other embodiments of the present disclosure, for example, the right-handed polarization film R and the left-handed polarization film L may also be arranged on the back of the cover body 10 by a fixed structure.

Figure 4:
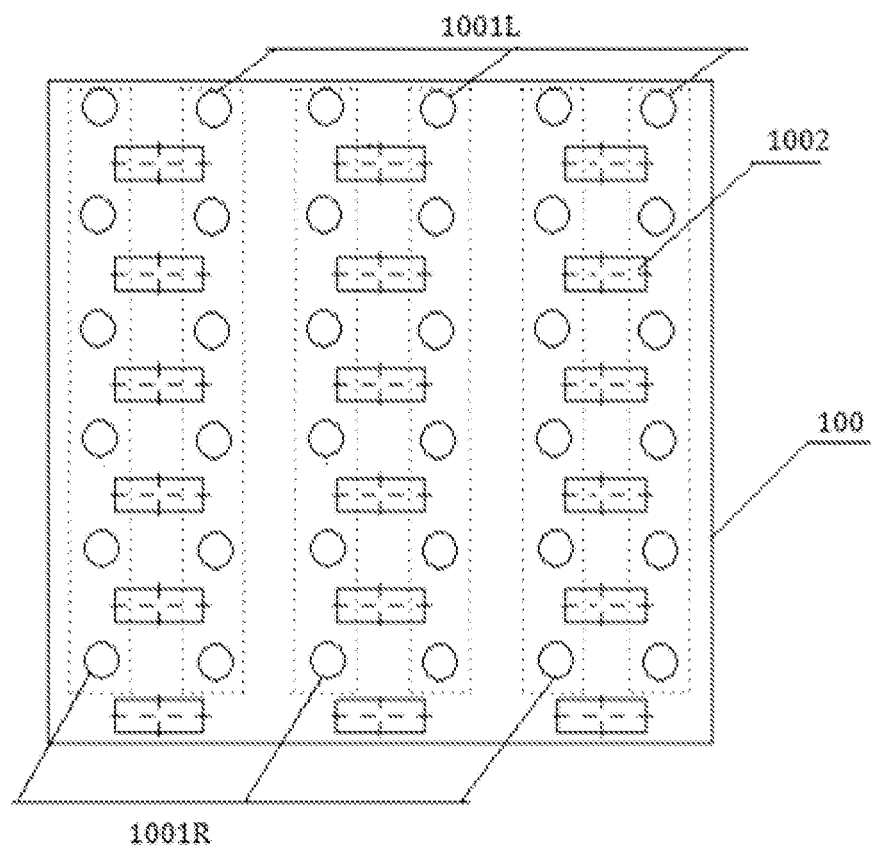
FIG. 4 shows a distribution diagram of the left and right light-emitting tubes of the area array driving plate according to an embodiment of the present disclosure.

In an embodiment of the present disclosure, as shown in FIG. 4, the area array driving plate 100 may be provided with an array arrangement, such as 18 left light-emitting tubes 1001L arranged in 6 rows*3 columns in the rectangular array, 18 right light-emitting tubes 1001R arranged in 6 rows*3 columns in the rectangular array, and 18 sound transmission spaces 1002 arranged in 6 rows*3 columns in the rectangular array.

Figure 5A:
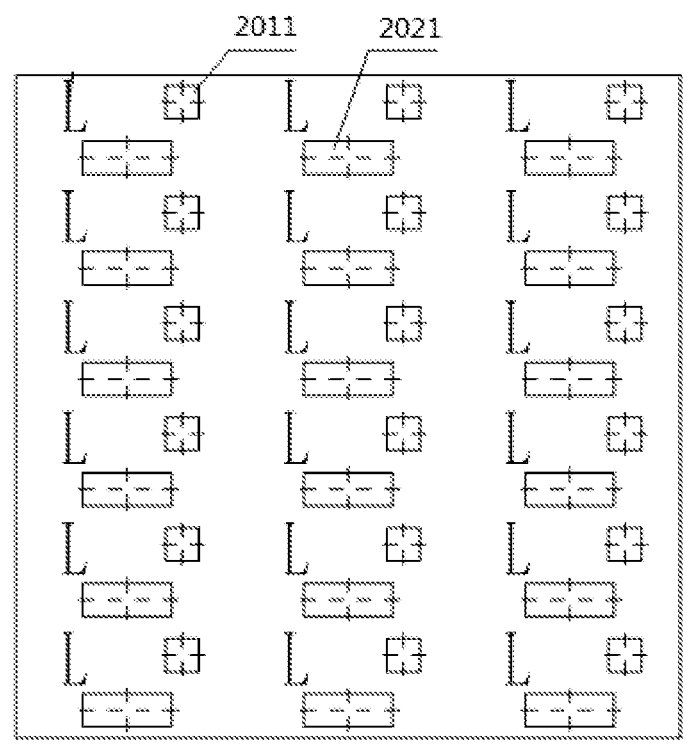
FIG. 5A shows a top view of a left-handed polarization film according to an embodiment of the present disclosure.

Further, as shown in FIG. 5A, the left-handed polarization film L may be provided with an array arrangement, such as 18 left-handed film through holes 2011 arranged in 6 rows*3 columns in the rectangular array and 18 left-handed film sound transmission spaces 2021 arranged in 6 rows*3 columns in the rectangular array. Moreover, the 18 left-handed film through holes 2011 arranged in 6 rows*3 columns in the rectangular array are in one-to-one correspondence to the left light-emitting tubes 1001L of the area array driving plate, and the 18 left-handed film sound transmission spaces 2021 arranged in 6 rows*3 columns in the rectangular array are in one-to-one correspondence to the sound transmission spaces 1002 of the area array driving plate.

Figure 5B:
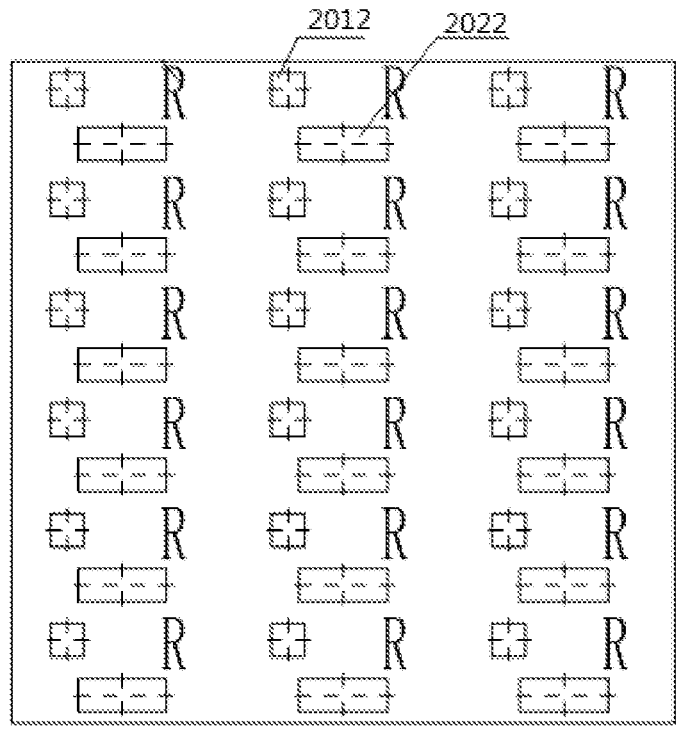
FIG. 5B shows a top view of a right-handed polarization film according to an embodiment of the present disclosure.

Further, as shown in FIG. 5B, the right-handed polarization film R may be provided with an array arrangement, such as 18 right-handed film through holes 2012 arranged in 6 rows*3 columns in the rectangular array and 18 right-handed film sound transmission spaces 2022 arranged in 6 rows*3 columns in the rectangular array. Moreover, the 18 right-handed film through holes 2012 arranged in 6 rows*3 columns in the rectangular array are in one-to-one correspondence to the right light-emitting tubes 1001R of the area array driving plate, and the 18 right-handed film sound transmission spaces 2022 arranged in 6 rows*3 columns in the rectangular array are in one-to-one correspondence to the 18 left-handed film sound transmission spaces 2021 arranged in 6 rows*3 columns in the rectangular array.

Figure 5C:
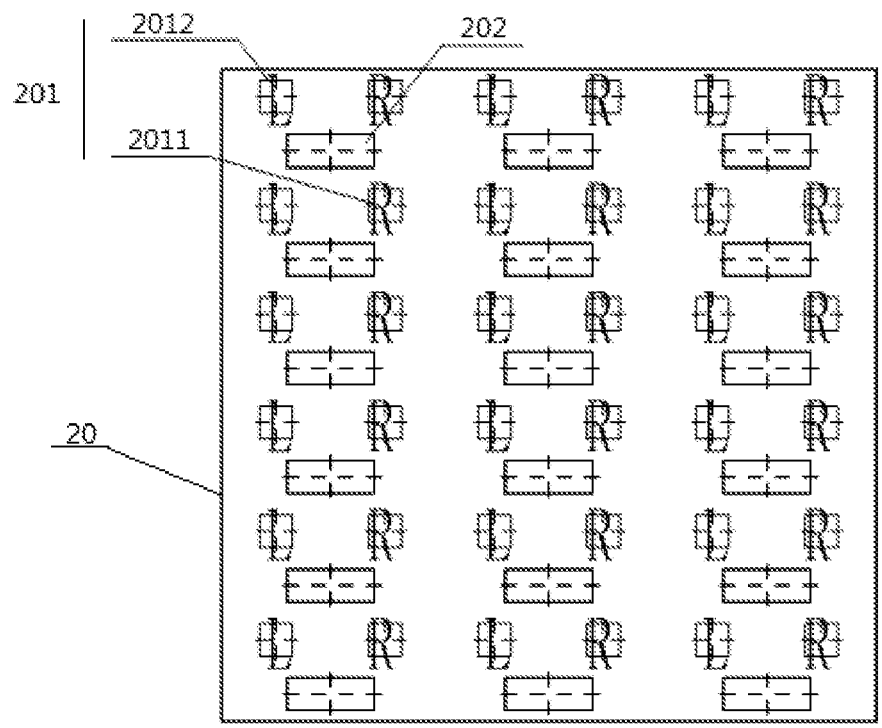
FIG. 5C shows a top view of a polarization film assembly according to an embodiment of the present disclosure.

Thus, the left-handed polarization film L and the right-handed polarization film R, which are laminated by adhering, constitute the polarization film assembly 20 shown in FIG. 5C, that is, the circular polarization film assembly, which is provided with array arrangement. For example, 36 polarization film through holes 201 arranged in 6 rows*6 columns in the rectangular array (The polarization film through holes 201 including 18 left-handed film through holes 2011 arranged in 6 rows*3 columns in the rectangular array and 18 right-handed film through holes 2012 arranged in 6 rows*3 columns in the rectangular array), and 18 polarization film sound transmission spaces 202 arranged in 6 rows*3 columns in the rectangular array constitute the polarization film assembly 20, that is, the circular polarization film assembly. Thus, the right-handed polarization film R may be transmitted through the left-handed film through holes 2011, and the left-handed polarization film L may be transmitted through the right-handed film through holes 2012.

Figure 6:
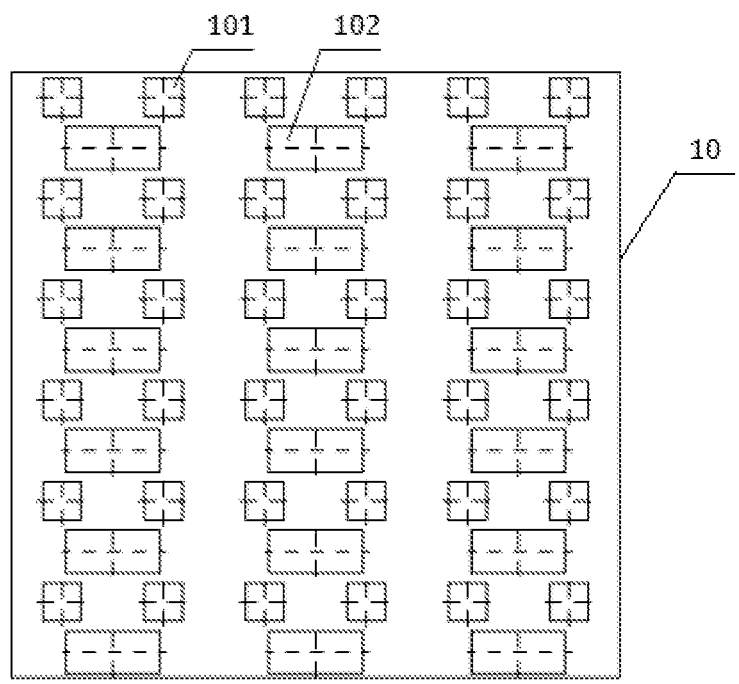
FIG. 6 shows a top view of a cover body according to an embodiment of the present disclosure.

In an embodiment of the present disclosure, as shown in FIG. 6, corresponding to the polarization film assembly 20 shown in FIG. 5C, which is the circular polarization film assembly, the cover body 10 may be provided with 36 cover through holes 101 arranged in 6 rows*6 columns in a rectangular array, and 18 cover sound transmission spaces 102 arranged in 6 rows*3 columns in the rectangular array. The 36 cover through holes 101 arranged in 6 rows*6 columns in the rectangular array are in one-to-one correspondence to the 36 polarization film through holes 201 arranged in 6 rows*6 columns in the rectangular array (the polarization film through holes 201 including 18 left-handed film through holes 2011 arranged in 6 rows*3 columns in the rectangular array and 18 right-handed film through holes 2012 arranged in 6 rows*3 columns in the rectangular array). The 18 cover sound transmission spaces 102 arranged in 6 rows*3 columns in the rectangular array are in one-to-one correspondence to the 18 polarization film sound transmission spaces 202 arranged in 6 rows*3 columns in the rectangular array.

Figure 7:
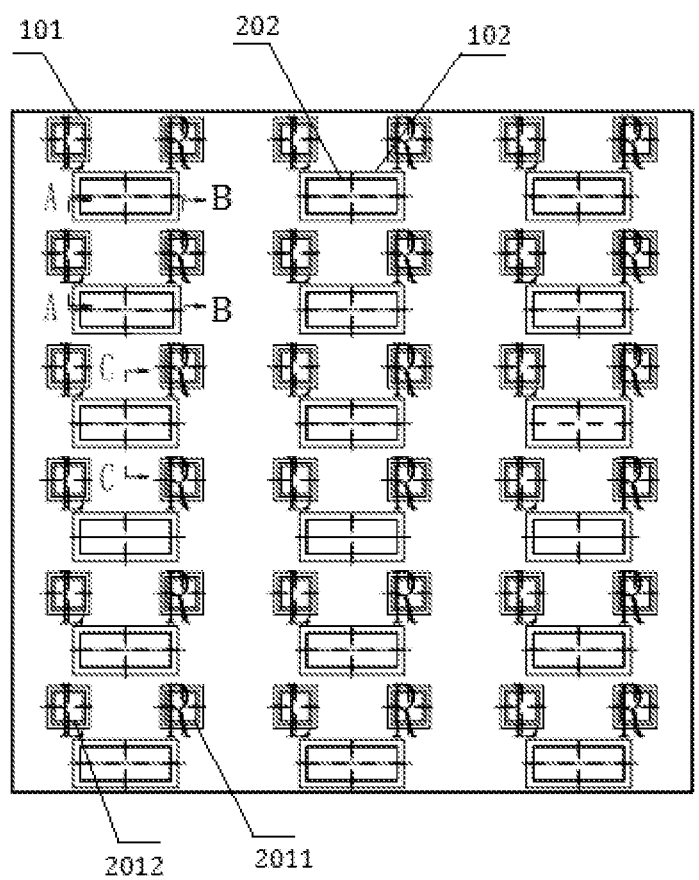
FIG. 7 shows a top view of a display screen module according to an embodiment of the present disclosure.

Thus, as described above, the display screen module shown in FIG. 7 may be formed by the area array driving plate 100, the polarization film assembly 20 arranged to correspond to the area array driving plate 100, and the cover body 10 arranged to correspond to the polarization film assembly 20.

Figure 8A:
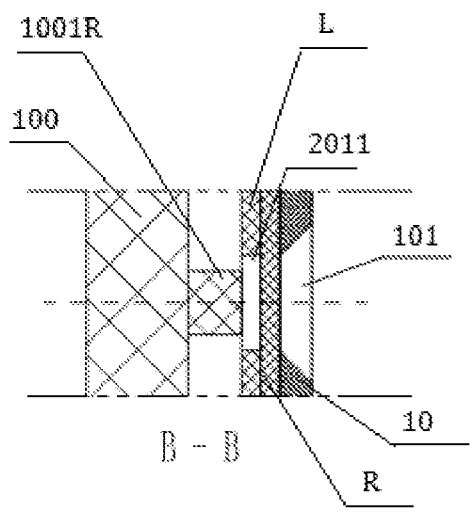
FIG. 8A shows a B-B cross-section of the display screen module according to an embodiment of the present disclosure.
Figure 8B:
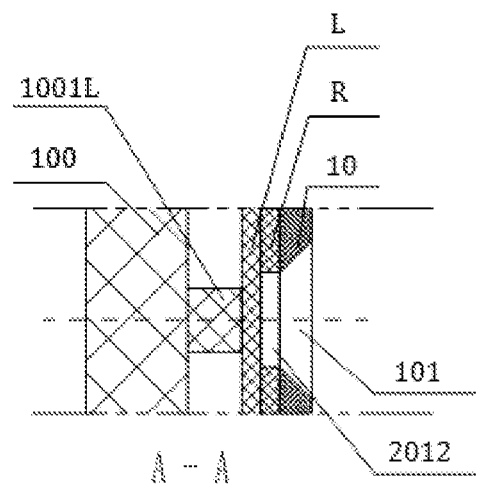
FIG. 8B shows an A-A cross-section of the display screen module according to an embodiment of the present disclosure.
Figure 8C:
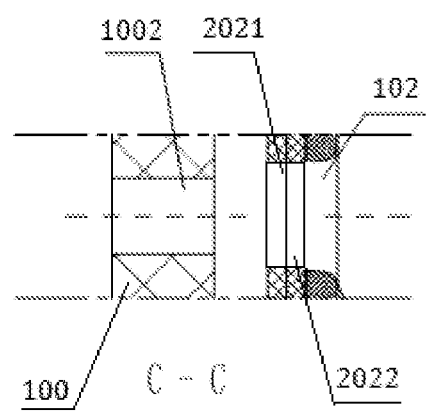
FIG. 8C shows a C-C cross-section view of the display screen module according to an embodiment of the present disclosure.

The position relationship between the light-emitting tube 1001 of the area array driving plate, the left-handed film through hole 2011, the right-handed film through hole 2012 and the cover through hole 101, and the position relationship between the sound transmission space 1002 of the area array driving plate, the left-handed film sound transmission space 2021, the right-handed film sound transmission space 2022 and the cover sound transmission space 102, will be further described below in detail in combination with the cross-sectional views of the display screen module shown in FIGS. 8A, 8B and 8C, which are the cross-sectional views along B-B, A-A and C-C.

Specifically, as shown in FIG. 8A, corresponding to the light-emitting tube 1001 of the area array driving plate, such as the left light-emitting tube 1001L of the area array driving plate, the left-handed polarization film L may be provided with the left-handed film through hole 2011. Corresponding to the left-handed film through hole 2011, the cover body 10 may be provided with the cover through hole 101. Therefore, the right-handed polarization film R may be transmitted through the left-handed film through hole 2011 and the cover through hole 101.

Specifically, as shown in FIG. 8B, corresponding to the light-emitting tube 1001 of the area array driving plate, such as the right light-emitting tube 1001R of the area array driving plate, the right-handed polarization film R may be provided with the right-handed film through hole 2012. Corresponding to the right-handed film through hole 2012, the cover body 10 may be provided with the cover through hole 101. Therefore, the left-handed polarization film L may be transmitted through the right-handed film through hole 2012 and the cover through hole 101.

Specifically, as shown in FIG. 8C, corresponding to the sound transmission space 1002 of the area array driving plate, the left-handed polarization film L and the right-handed polarization film R may be provided with the left-handed film sound transmission space 2021 and the right-handed film sound transmission space 2022, respectively. Corresponding to the left-handed film sound transmission space 2021 and the right-handed film sound transmission space 2022, the cover body 10 may be provided with the cover sound transmission space 102. Through arranging the sound transmission space 1002 of the area array driving plate, the left-handed film sound transmission space 2021, the right-handed film sound transmission space 2022, and the cover sound transmission space 102 in correspondence, the accurate sound positioning can be realized.

More specifically, as shown in FIGS. 8A and 8B, the cover through hole 101 may be configured as a circular through hole, and the inner side of the cover through hole 101 may be chamfered, making its cross-section a trapezoidal shape, thereby increasing the emitting angle of light passing through the cover. The shape of the cover through hole 101 may be any shape, for example, in other embodiments of the present disclosure, the cover through hole 101 may also be configured as a square through hole.

More specifically, as shown in FIG. 8C, the cover sound transmission space 102 may be configured as a circular sound transmission space, and the inner side of the cover sound transmission space 102 may be provided with an arc chamfer, so that its cross-section takes a parabolic shape, thereby increasing the diffusion angle of sound passing through the cover, making the sound effect more balanced and improving the sound transmission effect. The shape of the cover sound transmission space 102 may be any shape, for example, in other embodiments of the present disclosure, the cover sound transmission space 102 may also be configured as a square sound transmission space.

The present disclosure has the following advantages.

The display screen cover of the present disclosure is arranged to correspond to the area array driving plate of the display screen, and the polarization film through holes and the polarization film sound transmission spaces are arranged to correspond to the area array driving plate. In addition, the cover through holes and the cover sound transmission spaces are arranged to respectively correspond to the polarization film through holes and the polarization film sound transmission spaces. Therefore, the accurate positioning of sound synchronized with the picture can be realized to improve the audio-visual effect.

Corresponding to the above embodiment, the present disclosure further provides a display screen.

The display screen provided by an embodiment of the present disclosure includes the display screen cover provided by the above embodiment. A ratio of the sound transmission spaces to the display screen ranges from 0 to 40%, and the specific implementation method refers to the above embodiment.

The present disclosure has the following advantages

The display screen of the present disclosure includes the display screen cover provided by the above embodiment. The display screen cover is arranged to correspond to the area array driving plate of the display screen, and the polarization film through holes and the polarization film sound transmission spaces are arranged to correspond to the area array driving plate. In addition, the cover through holes and the cover sound transmission spaces are arranged to respectively correspond to the polarization film through holes and the polarization film sound transmission spaces. Therefore, the accurate positioning of the sound synchronized with the picture can be realized to improve the audio-visual effect.

In the description of the present disclosure, the terms "first" and "second" are used only for descriptive purposes and cannot be understood to indicate or imply relative importance or implicitly indicate the number of indicated technical features. Thus, features defined as "first" and "second" may include one or more of these features either explicitly or implicitly. "multiple" means two or more, unless otherwise clearly and specifically defined.

In this present disclosure, unless otherwise clearly specified and defined, the terms "installation", "connection", "conjoined", and "fixed" should be understood in a broad sense. For example, "connection" may be a fixed connection, a detachable connection, or integrated; it may be a mechanical connection or an electrical connection; it may be a direct connection or an indirect connection through an intermediate medium; it may be the internal connection of two components or the interaction of two elements. For those having ordinary skill in the art, the specific meaning of the above terms in the present disclosure can be understood according to specific situations.

In the present disclosure, unless specified and defined, the first feature "on" or "below" the second feature means that the first feature is in contact with the second feature directly, or indirectly through an intermediate medium. Moreover, the first feature "above" the second feature means that the first feature is directly above or obliquely above the second feature or only indicates that the level of the first feature is higher than that of the second feature. The first feature "under" the second feature means that the first feature is directly under or obliquely under the second feature or only indicates that the level of the first feature is less than that of the second feature.

In the description of this specification, the reference term "an embodiment", "some embodiments", "examples", "specific examples", "some examples", and the like means that the specific features, structures, materials, or characters described in combination with the embodiment or example are included in at least one embodiment or example of the present disclosure. In this specification, schematic representations of the above terms need not be directed to the same embodiment or example. Furthermore, the specific features, structures, materials, or characters described may be combined in an appropriate manner in any one or more embodiments or examples. In addition, under the condition of no contradiction, those skilled in the art can combine and integrate different embodiments or examples as well as the different features of the embodiments or examples described in this specification.

What is claimed is:

1. A display screen cover, wherein the display screen cover is arranged to correspond to an area array driving plate of a display screen, and the display screen cover comprises a cover body and a polarization film assembly, wherein
    the polarization film assembly is arranged on a back of the cover body, and the polarization film assembly is provided with polarization film through holes and polarization film sound transmission spaces, wherein the polarization film through holes are arranged to correspond to light-emitting tubes of the area array driving plate, and the polarization film sound transmission spaces are arranged to correspond to sound transmission spaces of the area array driving plate; and
    the cover body is provided with cover through holes and cover sound transmission spaces, wherein the cover through holes are arranged to correspond to the polarization film through holes, and the cover sound transmission spaces are arranged to correspond to the polarization film sound transmission spaces.

2. The display screen cover according to claim 1, wherein the light-emitting tubes are arranged in a first array on the area array driving plate, and the polarization film through holes of the polarization film assembly are arranged in a second array to correspond to the light-emitting tubes of the area array driving plate.

3. The display screen cover according to claim 1, wherein the sound transmission spaces are arranged in a third array on the area array driving plate, and the polarization film sound transmission spaces of the polarization film assembly are arranged in a fourth array to correspond to the sound transmission spaces of the area array driving plate.

4. The display screen cover according to claim 2, wherein the polarization film assembly is a circular polarization film assembly.

5. The display screen cover according to claim 2, wherein the polarization film assembly is a linear polarization film assembly.

6. The display screen cover according to claim 2, wherein the cover through holes of the cover body are arranged in a fifth array to correspond to the polarization film through holes of the polarization film assembly.

7. The display screen cover according to claim 3, wherein the cover sound transmission spaces of the cover body are arranged in a sixth array to correspond to the polarization film sound transmission spaces of the polarization film assembly.

8. The display screen cover according to claim 1, wherein each of the cover through holes is an arbitrary-shaped through hole.

9. The display screen cover according to claim 1, wherein each of the cover sound transmission spaces is an arbitrary-shaped sound transmission space.

10. A display screen, comprising the display screen cover according to claim 1, wherein a ratio of the sound transmission spaces to the display screen ranges from 0 to 40%.

11. The display screen cover according to claim 3, wherein the polarization film assembly is a circular polarization film assembly.

12. The display screen cover according to claim 3, wherein the polarization film assembly is a linear polarization film assembly.

13. The display screen cover according to claim 10, wherein the light-emitting tubes are arranged in a first array on the area array driving plate, and the polarization film through holes of the polarization film assembly are arranged in a second array to correspond to the light-emitting tubes of the area array driving plate.

14. The display screen cover according to claim 10, wherein the sound transmission spaces are arranged in a third array on the area array driving plate, and the polarization film sound transmission spaces of the polarization film assembly are arranged in a fourth array to correspond to the sound transmission spaces of the area array driving plate.

15. The display screen cover according to claim 13, wherein the polarization film assembly is a circular polarization film assembly.

16. The display screen cover according to claim 13, wherein the polarization film assembly is a linear polarization film assembly.

17. The display screen cover according to claim 13, wherein the cover through holes of the cover body are arranged in a fifth array to correspond to the polarization film through holes of the polarization film assembly.

18. The display screen cover according to claim 15, wherein the cover sound transmission spaces of the cover body are arranged in a sixth array to correspond to the polarization film sound transmission spaces of the polarization film assembly.

19. The display screen cover according to claim 10, wherein each of the cover through holes is an arbitrary-shaped through hole.

20. The display screen cover according to claim 10, wherein each of the cover sound transmission spaces is an arbitrary-shaped sound transmission space.

\* \* \* \* \*